US006982406B2

(12) United States Patent
Chen

(10) Patent No.: US 6,982,406 B2
(45) Date of Patent: Jan. 3, 2006

(54) SIMPLE CMOS LIGHT-TO-CURRENT SENSOR

(76) Inventor: Pao Jung Chen, 20872 Sola St., Cupertino, CA (US) 95014

( * ) Notice: Subject to any disclaimer, the term of this patent is extended or adjusted under 35 U.S.C. 154(b) by 194 days.

(21) Appl. No.: 10/406,053

(22) Filed: Apr. 3, 2003

(65) Prior Publication Data

US 2005/0258339 A1 Nov. 24, 2005

(51) Int. Cl.
*H01L 31/00* (2006.01)

(52) U.S. Cl. .............................. 250/214.1; 250/214 R; 250/208.1; 327/514; 257/292

(58) Field of Classification Search ............ 250/208.1, 250/214 R, 214.1; 257/292; 330/288
See application file for complete search history.

(56) References Cited

U.S. PATENT DOCUMENTS 5,241,575 A * 8/1993 Miyatake et al. ............. 377/60
5,572,074 A 11/1996 Standley
5,939,742 A * 8/1999 Yiannoulos ................. 257/292
6,043,525 A * 3/2000 Chen .......................... 257/292
6,133,563 A * 10/2000 Clark et al. .............. 250/208.1
6,188,059 B1 2/2001 Nishiyama et al.
6,201,270 B1 * 3/2001 Chen .......................... 257/292
6,201,617 B1 * 3/2001 Kusaka ....................... 358/482
6,410,900 B1 * 6/2002 Okamoto ................. 250/208.1
6,566,955 B1 * 5/2003 Tang .......................... 330/288
6,734,907 B1 * 5/2004 Hagihara et al. ........... 348/308
6,822,211 B2 * 11/2004 Hagihara ................. 250/208.1
2004/0061152 A1 * 4/2004 Kashiura et al. ............ 257/292

* cited by examiner

*Primary Examiner*—David Porta
*Assistant Examiner*—Davienne Monbleau
(74) *Attorney, Agent, or Firm*—Bo-In Lin

(57) ABSTRACT

A CMOS light-to-current sensor built on silicon substrate is disclosed in this invention. This light-to-current sensor includes a photo-diode and two MOS transistors. The first MOS transistor is connected as the load transistor for the photo-generated current from the photo-diode, and the second MOS transistor is connected as the current-mirror transistor for the first transistor to output a current linearly proportional to the photo-generated current to the external resistor connected to the sensor.

10 Claims, 8 Drawing Sheets

SIMPLE CMOS LIGHT-TO-CURRENT SENSOR

TECHNICAL FIELD OF THE INVENTION

This invention relates to a photo-detector used as a photometer to provide a measurement of the amount of light power incident on the detector. Particular applications for these photometers include power-saving control for street lights and domestic appliances, back-lighting of displays in cellular phones, notebook PCs, PDAs, video cameras, digital still cameras, and other equipment requiring luminosity adjustment.

BACKGROUND OF THE INVENTION

A photometer IC can be constructed by using a light-to-voltage sensor or a light-to-current sensor. A light-to-voltage sensor combines a photo-diode 10 and a trans-impedance amplifier 15 on a single monolithic IC, such as the TSL251R light-to-voltage optical sensor (1) described in its data sheet by Texas Advanced Optoelectronic Solutions Inc., and is illustrated in FIG. 1. The trans-impedance amplifier 15 senses the current Iph generated by the photo-diode 10 and outputs a voltage proportional linearly to the photo-generated current. A light-to-current sensor combines a photo-diode 20 and a current amplifier 25 on a single monolithic IC, such as the TPS851 light-to-current optical sensor (2) described in its data sheet by Toshiba Corp., and is illustrated in FIG. 2. Both sensors are widely used to measure the lighting brightness in the displays of cellular phones and portable devices. The trans-impedance amplifier 15 of the light-to-voltage sensor is quite complicated to implement as an integrated circuit, and the current amplifier 25 of the TPS851 light-to-current sensor is implemented in sophisticated bipolar integrated circuits and manufactured using expensive bipolar process technology.

Introductory technical reference for designing the trans-impedance amplifiers and the current amplifiers can be found in the book (3) titled "Analysis and Design of Analog Integrated Circuits" by Paul R. Gray and Robert G. Meyer.

As more functioning chips are packed into electronic portable devices, the demand for smaller and more cost-effective photo-sensor chips increases.

SUMMARY OF THE INVENTION

The photo-detector of this invention is a CMOS light-to-current sensor which is comprised of a photo-diode and two MOS transistors illustrated in FIGS. 3 and 4. As illustrated in FIG. 5, in a typical CMOS n-well process technology using a p-type substrate wafer, the photo-diode is constructed by an n+ diffusion layer thermally-diffused on top of the p-type substrate, and the two MOS transistors are p-channel transistors built in the n-well region. As illustrated in FIG. 3, the circuit configuration of the sensor is as follows: the photo-diode is connected in reverse biased condition having its p-type substrate node connected to the most negative potential of the sensor such as the ground and its n+ diffusion node connected to both the drain and the gate terminals of a p-type MOS transistor. The p-type MOS transistor functions as the load transistor for the photo-diode, the source terminal of this transistor is connected to the positive supply voltage of the sensor. A second p-type MOS transistor is connected as the current-mirror transistor for the first transistor, having its gate terminal connected to the gate terminal of the first transistor and its source terminal connected to the source terminal of the first transistor. The drain terminal of this second transistor is the output node of the sensor, which will output an amplified current linearly proportional to the photo-diode current to an external resistor.

The operation of this CMOS light-to-current sensor is described as follows: In the dark condition when no light is incident on the photo-diode, a small dark thermal-leakage current having the value of several nano-Amperes, (1 nano Ampere is equal to 1.0E-9 Amperes), will flow through the photo-diode and the load transistor. Under this condition, the gate-to-source voltage of the transistor is very close to the threshold voltage (Vtp) of the transistor. Because the second transistor is connected as the current-mirror transistor to the photo-diode load transistor, the current that flows through the second transistor to the external resistor will be linearly proportional to the dark leakage current of the photo-diode, and the voltage at the output node is very close to the ground potential. In the light luminance condition when the light photons illuminate on the photo-diode, the photo-generated electron and hole carriers beneath the photo-diode silicon area will diffuse to the space-charge region of the n+-p junction of the photo-diode and will be separated as the photo-generated current. The photo-generated current will flow through the load transistor and increase the voltage difference between the gate and the source terminals. Similarly, the current of the second current-mirror transistor will rise proportionally to the photo-diode current and will flow through the external resistor.

The linear proportional factor of the current of the second transistor to the photo-diode current depends on the number of the duplication of the first transistor used to form the second transistor. If an output current having a large multiplication factor to the photo-diode current is needed, it can be obtained by cascading multiple current-mirror circuits together. This will minimize the size of the chip. Sample circuit configurations for this requirement are illustrated in FIG. 6 and FIG. 7.

The preliminary SPICE circuit simulation shows that the sensor of this invention can output an output current linearly, when the intensity of the light on the photo-diode varies from 1 lux to 1000 lux. The simulated transfer curve is illustrated in FIG. 8.

This invention demonstrates a very small, high performance, and cost-effective CMOS light-to-current sensor which is very suitable for applications in power-saving control of the display units of many portable electronic devices.

DESCRIPTION OF THE PREFERRED EMBODIMENT

The photo-detector of this invention is a CMOS light-to-current sensor which is comprised of a photo-diode and two MOS transistors.

Figure 1:
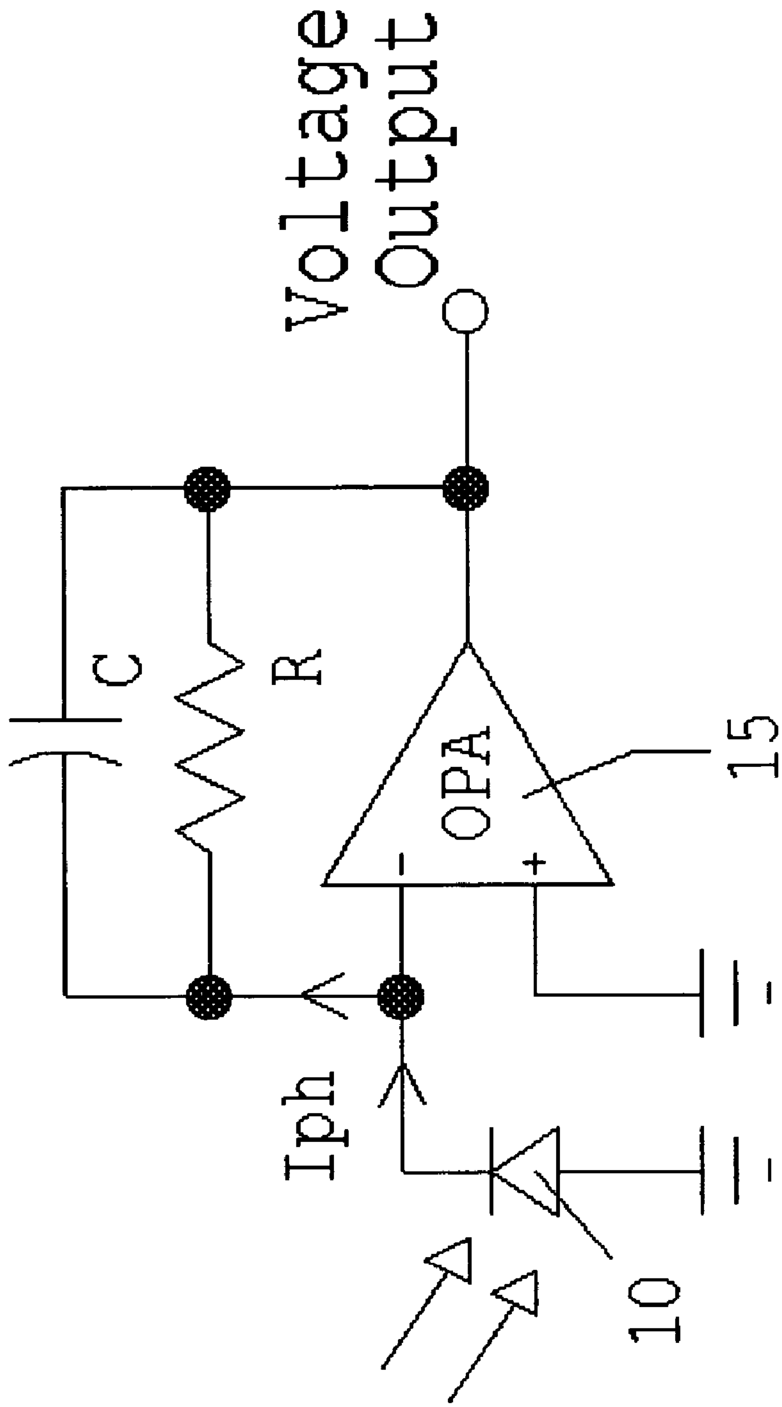
FIG. 1 illustrates the functional block diagram of a photometer constructed by a light-to-voltage sensor.
Figure 2:
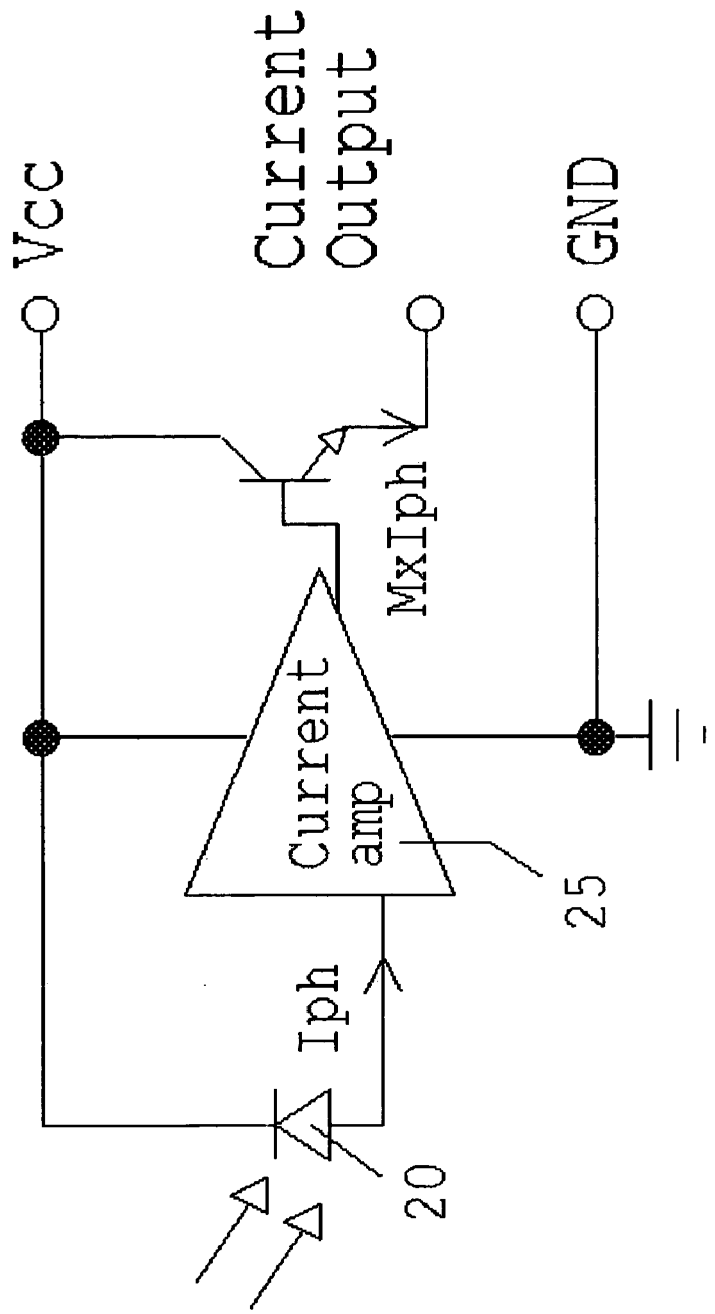
FIG. 2 illustrates the functional block diagram of a photometer constructed by a light-to-current sensor.
Figure 3:
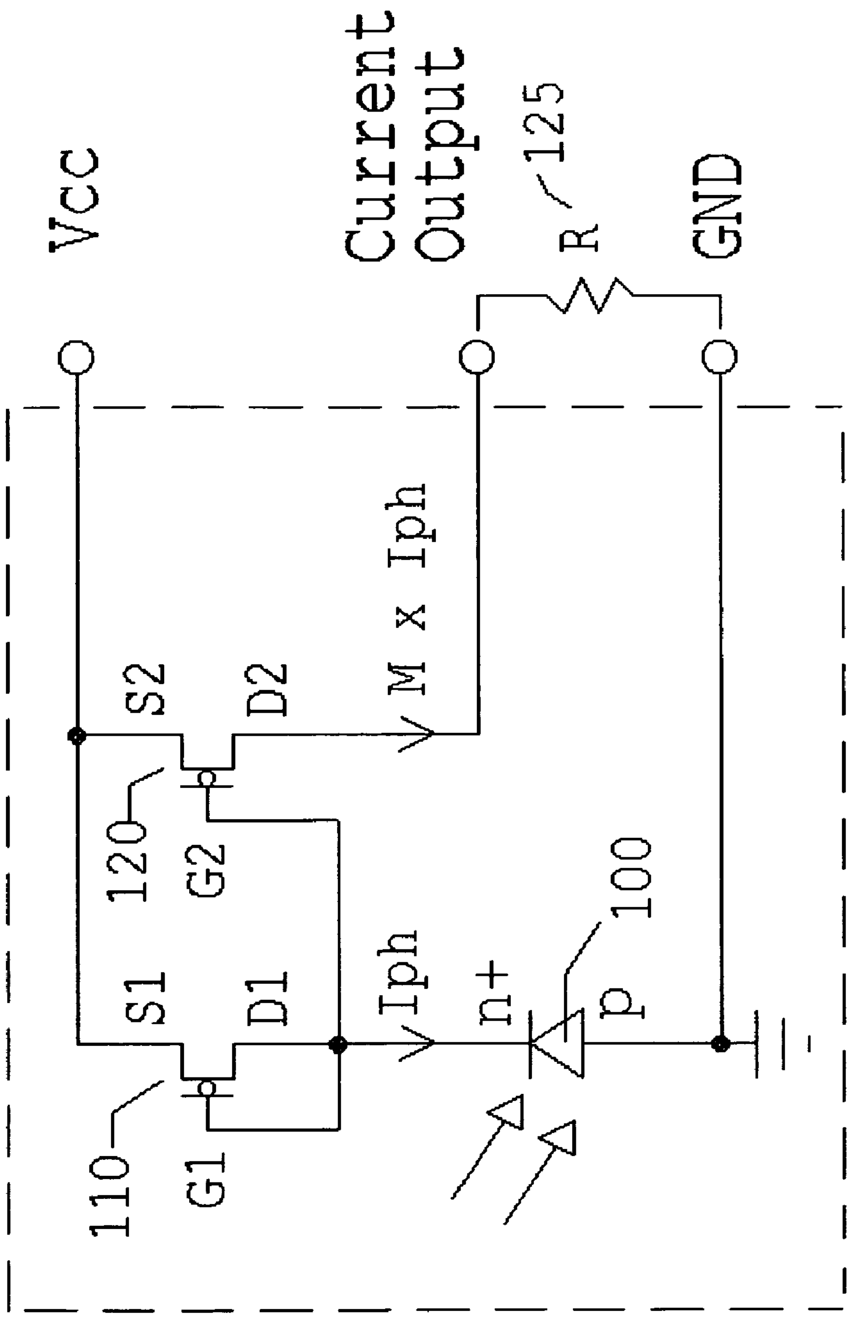
FIG. 3 illustrates the circuit diagram of a photometer constructed by a CMOS light-to-current sensor built on a p-type substrate wafer.
Figure 4:
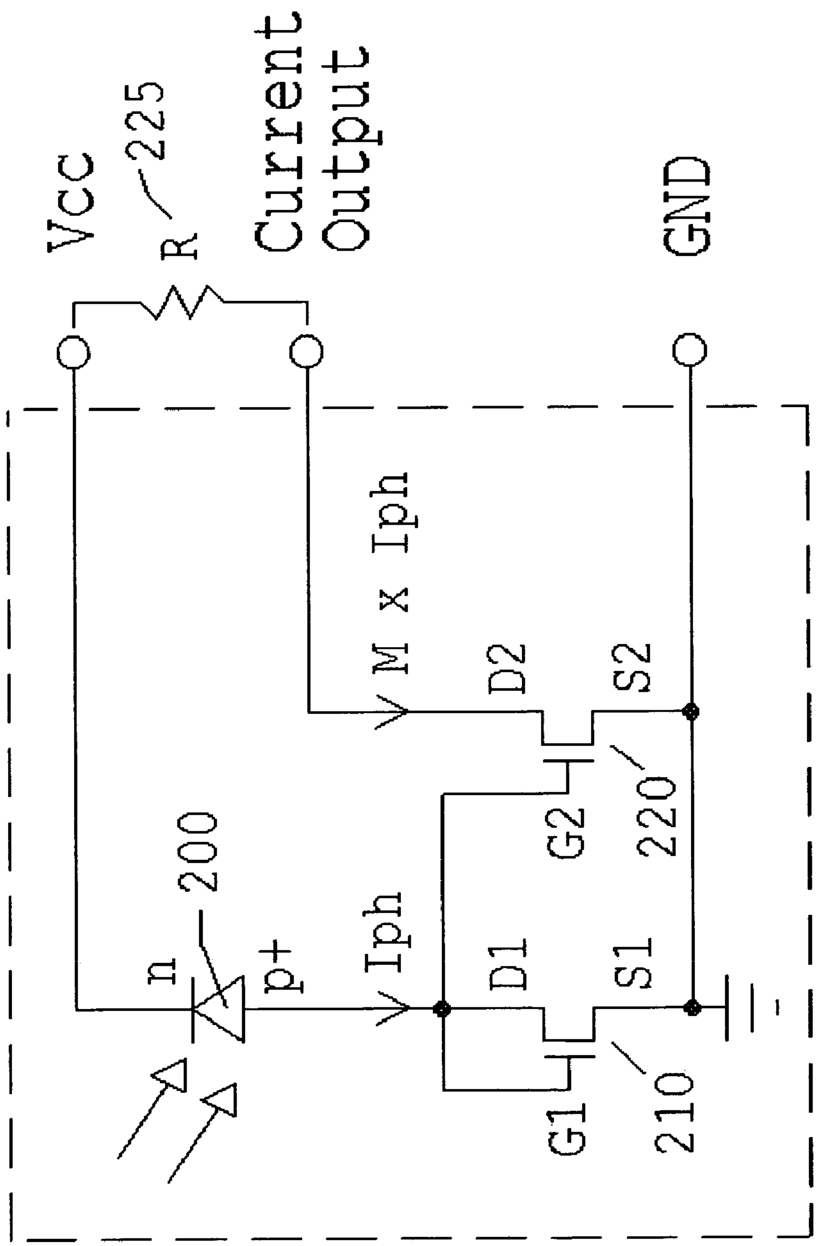
FIG. 4 illustrates the circuit diagram of a photometer constructed by a CMOS light-to-current sensor built on an n-type substrate wafer.

Referring to FIG. 3 of the present invention, a CMOS light-to-current sensor built on a p-type substrate wafer is illustrated, the photo-diode 100 is an n+-p junction photo-diode and the two MOS transistors 110 (G1) and 120 (G2) are p-channel transistors built in the n-well region. Also referring to FIG. 4 of the present invention, a CMOS light-to-current sensor built on an n-type substrate wafer is illustrated, the photo-diode 200 is a p+-n junction photo-diode and the two MOS transistors 210 (G1) and 220 (G2) are n-channel transistors built in the p-well region.

Figure 5:
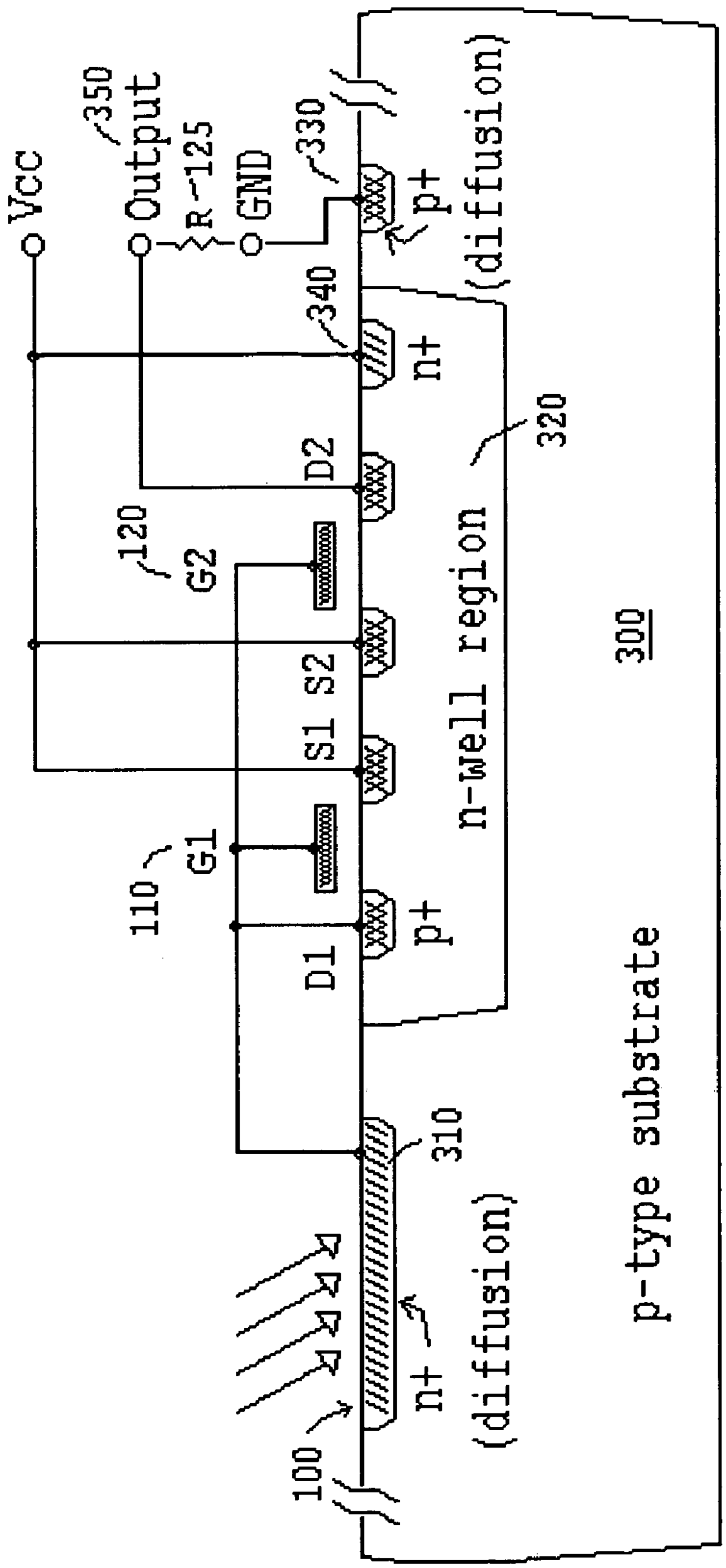
FIG. 5 illustrates a cross sectional view of the COMS light-to-current sensor presented in FIG. 3.

As illustrated in FIG. 5, in a typical CMOS n-well process technology using a p-type substrate wafer 300, the photo-diode 100 is constructed by an n+ diffusion layer 310 thermally-diffused on top of the p-type substrate 300, and the two MOS transistors 110 (G1) and 120 (G2) are p-channel transistors built in the n-well region 320. As illustrated in FIG. 3, the circuit configuration of the sensor is as follows: the photo-diode 100 is connected in reverse biased condition having its p-type substrate 300 connected to the most negative potential of the sensor such as the ground 330 and its n+ diffusion node 310 connected to both the drain D1 and the gate terminals G1 of a p-type MOS transistor 110. The p-type MOS transistor 110 functions as the load transistor for the photo-diode 100, the source terminal S1 of this transistor is connected to the positive supply voltage Vcc of the sensor. A second p-type MOS transistor 120 is connected as the current-mirror transistor for the first transistor 110 having its gate terminal G2 connected to the gate terminal G1 of the first transistor 110 and its source terminal S2 connected to the source terminal S1 of the first transistor 110. The drain terminal D2 of this second transistor 120 is the output node 350 of the sensor, which will output an amplified current linearly proportional to the photo-diode current to an external resistor R 125.

The operation of this CMOS light-to-current sensor is described as follows: In the dark condition when no light is incident on the photo-diode 100, a small dark thermal-leakage current having the value of several nano-Amperes, (1 nano-Ampere is equal to 1.0E-9 Ampere), will flow through the photo-diode 100 and the load transistor 110. Under this condition, the gate-to-source voltage of the load transistor 110 is very close to the threshold voltage (Vtp) of the transistor. Because the second transistor 120 is connected as the current-mirror transistor to the photo-diode load transistor 110, the current that flows through the second transistor 120 to the external resistor will be linearly proportional to the dark leakage current of the photo-diode 100, and the voltage of the output node 350 is very close to the ground potential 330. In the light luminance condition when the light photons illuminate on the photo-diode 100, the photo-generated electron and hole carriers beneath the photo-diode silicon area will diffuse to the space-charge region of the n+-p junction of the photo-diode 100 and will be separated as the photo-generated current. The photo-generated current will flow through the load transistor 110 and increase the voltage difference between the gate and source terminals G1 and S1. Similarly, the current of the second current-mirror transistor 120 will rise proportionally to the photo-diode current and will flow through the external resistor.

Figure 6:
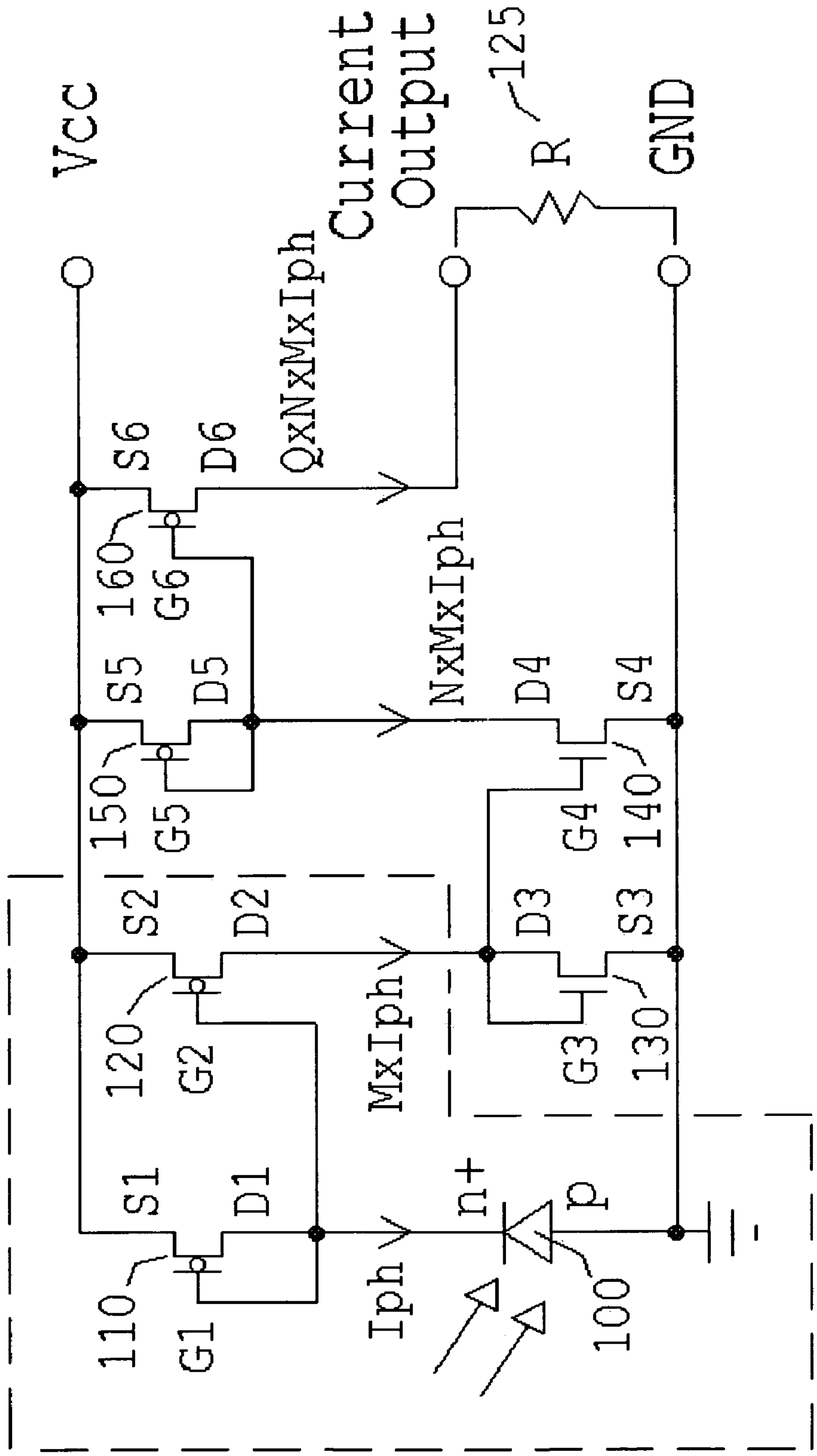
FIG. 6 illustrates the circuit diagram of a photometer constructed by a CMOS light-to-current sensor with cascading current-mirror circuits built on a p-type substrate wafer.
Figure 7:
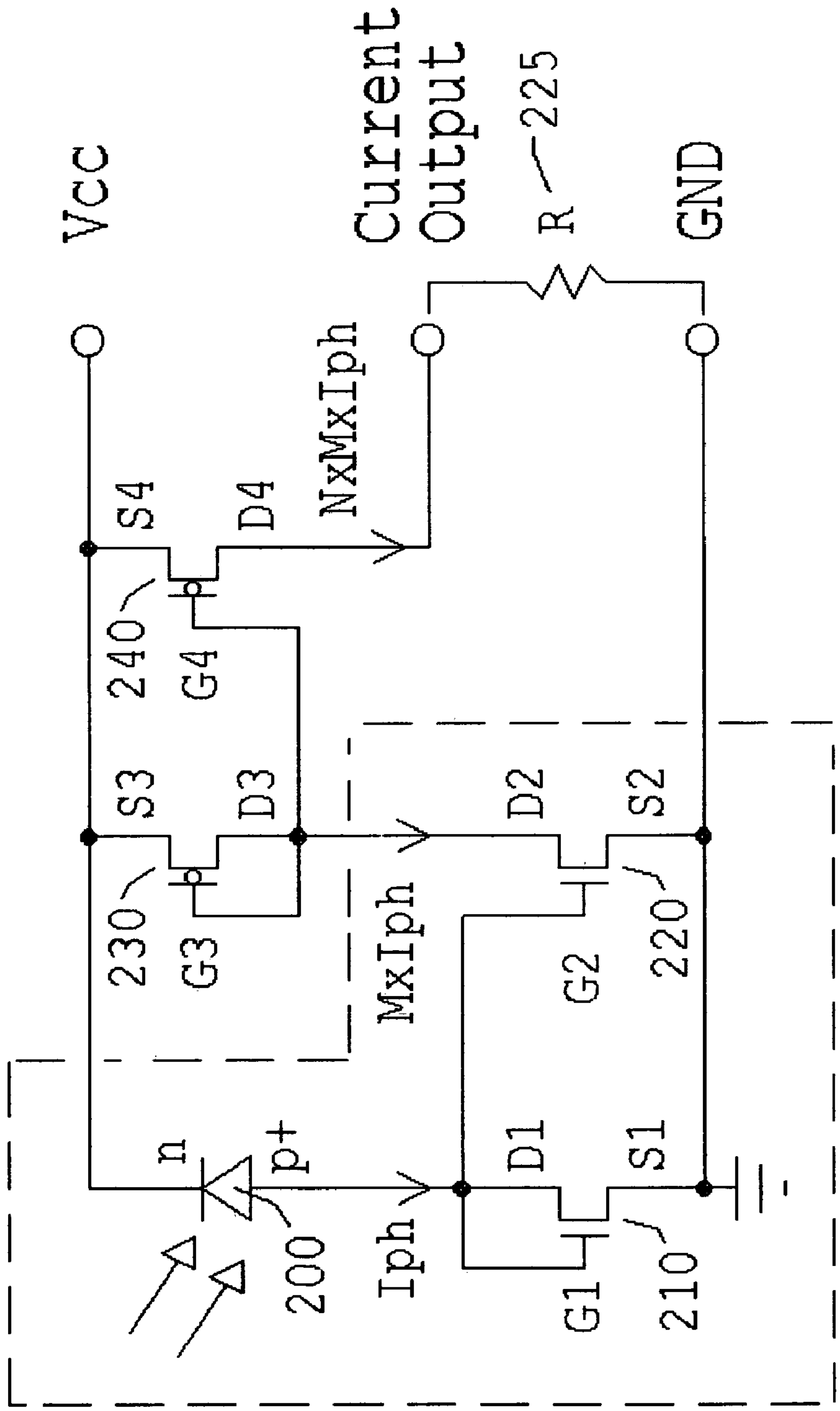
FIG. 7 illustrates the circuit diagram of a photometer constructed by a CMOS light-to-current sensor with cascading current-mirror circuits built on an n-type substrate wafer.

The linear proportional factor of the current of the second transistor 120 to the photo-diode current depends on the numbers of the duplication of the first transistor 110 used to form the second transistor 120. If an output current with a large multiplication factor to the photo-diode current is needed, it can be obtained by cascading multiple current-mirror circuits together. This will minimize the size of the chip. Sample circuit configurations for this requirement are illustrated in FIG. 6 and FIG. 7 with cascaded current mirrors comprising transistors 130 to 160 and 230 to 240 respectively.

Figure 8:
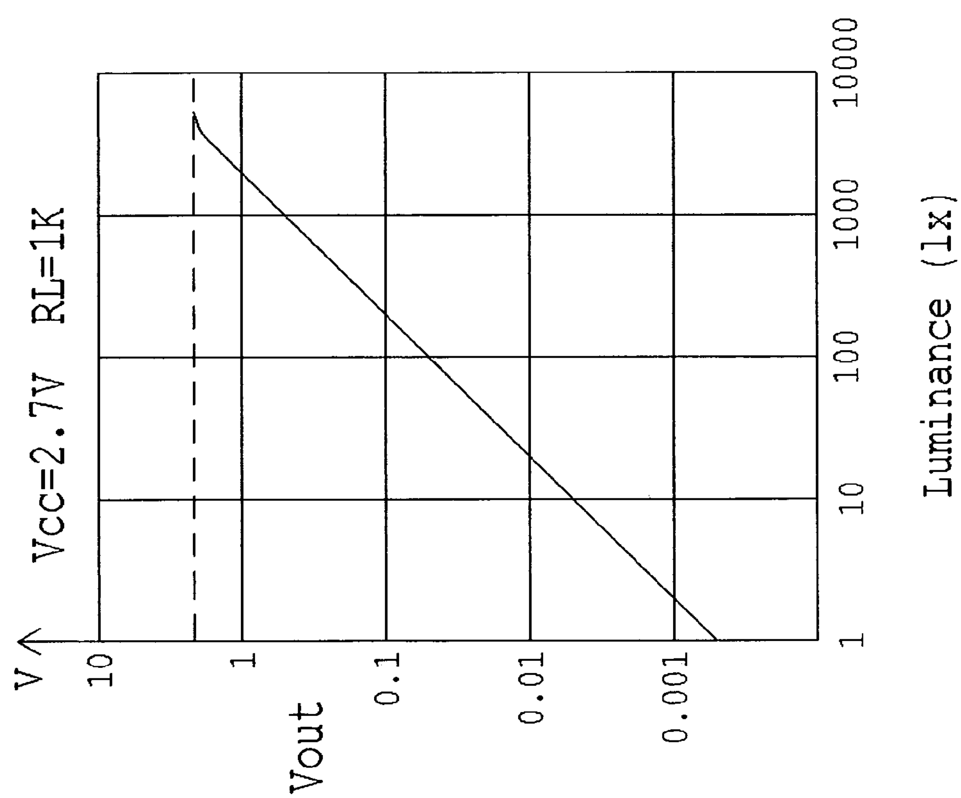
FIG. 8 illustrates a transfer curve of the light-to-current sensor presented in FIG. 3.

The preliminary SPICE circuit simulation shows that the sensor of this invention can output an output current linearly, when the intensity of the light on the photo-diode varies from 1 lux to 1000 lux. The simulated transfer curve representing the functional relationship between Vout versus the variation of luminance is illustrated in FIG. 8.

This demonstrates a very small, high performance, and cost-effective CMOS light-to-current sensor which is very suitable for applications in the power-saving control of the display units of many portable electronic devices.

The above disclosure is not intended as limiting. Those skilled in the art will readily observe that numerous modifications and alternations of the device may be made while retaining the substance of the invention. Accordingly, the above disclosure should be construed as limited only by the metes and bounds of the appended claims.

What is claimed is:

1. A CMOS light-to-current sensor chip supported on a semiconductor substrate comprising:

a p-n junction photo-diode having a photo-current generating node;

a first MOS transistor functioning as a transistor load having a drain terminal and a gate terminal connected to the photo-current generating node of said p-n junction photo-diode, and a source terminal connected to a voltage supplying node; and a second MOS transistor functioning as a current-mirror transistor of said first MOS transistor having a gate terminal connected to the gate terminal of said first MOS transistor, a source terminal connected to the source terminal of said first MOS transistor, and a drain terminal for outputting a substantially linearly amplified current proportional to the photo-generated current of said photo-diode to an external resistor load.

2. The CMOS light-to-current sensor of claim 1 wherein:

said semiconductor substrate is a p-type semiconductor substrate, said p-n junction photo-diode is an n+-p junction photo-diode, and said first and second MOS transistors are p-channel MOS transistors.

3. The CMOS light-to-current sensor of claim 1 wherein:

said semiconductor substrate is an n-type semiconductor substrate, said p-n junction photo-diode is a p+-n junction photo-diode, and said first and second MOS transistors are n-channel MOS transistors.

4. A light-to-current sensor comprising a semiconductor chip supported on a substrate, further comprising:

a photo-diode provided for generating a photo-current in response to an incident light projected thereon;

a first transistor connected to said photo-diode for functioning as the load transistor of said photo-current; and a second transistor connected to said first transistor for generating a substantially linearly amplifying current proportional to said photo-current for sensing said incident light.

5. The light-to-current sensor of claim 4 wherein:

said photo-diode further comprising a p-n junction photo-diode having a current generation node connected to said first transistor.

6. The light-to-current sensor of claim 4 wherein:

said first and second transistors are CMOS transistors.

7. The light-to-current sensor of claim 4 wherein:

said first and second transistors are p-channel MOS transistors.

8. The light-to-current sensor of claim 4 wherein:

said first and second transistors are n-channel MOS transistors.

9. A CMOS light-to-current sensor chip supported on a semiconductor substrate comprising:

a p-n junction photo-diode having a photo-current (Iph) generating node;

a $1^{st}$ current-mirror circuit having a first MOS transistor and a second MOS transistor wherein said first MOS transistor functioning as a transistor load of said photo-current, and said second MOS transistor functioning as a current-mirror transistor of said first transistor transmitting substantially a linearly amplifying current (M×Iph) through the drain terminal;

a $2^{nd}$ current-mirror circuit having a third MOS transistor and a fourth MOS transistor wherein said third MOS transistor functioning as a transistor load of said amplifying current (M×Iph) of said second MOS transistor, and said fourth MOS transistor functioning as a current-mirror transistor of said third transistor transmitting substantially ft a linearly amplifying current (N×M×Iph) through the drain terminal; and a $3^{rd}$ current-mirror circuit having a fifth MOS transistor and a sixth MOS transistor wherein said fifth MOS transistor functioning as a transistor load of said amplifying current (N×M×Iph) of said fourth MOS transistor, and said sixth MOS transistor functioning as a current-mirror transistor of said fifth transistor transmitting substantially a linearly amplifying current (Q×N×M×Iph) through the drain terminal to the external resistor load.

10. A CMOS light-to-current sensor chip supported on a semiconductor substrate comprising:

a p-n junction photo-diode having a photo-current (Iph) generating node;

a $1^{st}$ current-mirror circuit having a first MOS transistor and a second MOS transistor wherein said first MOS transistor functioning as a transistor load of said photo-current (having a drain terminal and a gate terminal connected to the photo-current generating node of said p-n junction photo-diode, and a source terminal connected to a voltage supplying node), and said second MOS transistor functioning as a current-mirror transistor of said first transistor transmitting substantially a linearly amplifying current (M×Iph) through the drain terminal; and a $2^{nd}$ current-mirror circuit having a third MOS transistor and a fourth MOS transistor wherein said third MOS transistor functioning as a transistor load of said amplifying current (M×Iph) of said second MOS transistor, and said fourth MOS transistor functioning as a current-mirror transistor of said third transistor transmitting substantially a linearly amplifying current (N×M×Iph) through the drain terminal to the external resistor load.

* * * * *